(12) United States Patent
Gallagher et al.

(10) Patent No.: US 6,957,278 B1
(45) Date of Patent: Oct. 18, 2005

(54) REFERENCE-SWITCH HYSTERESIS FOR COMPARATOR APPLICATIONS

(75) Inventors: Kevin J. Gallagher, Co. Cork (IE); Gerald D. Murphy, Co. Cork (IE); Anthony G. Dunne, Co. Cork (IE)

(73) Assignee: Cypress Semiconductor Corp., San Jose, CA (US)

(*) Notice: Subject to any disclaimer, the term of this patent is extended or adjusted under 35 U.S.C. 154(b) by 714 days.

(21) Appl. No.: 09/605,311

(22) Filed: Jun. 28, 2000

(51) Int. Cl.[7] .............. G06F 13/00; H03K 5/153; H03K 5/24

(52) U.S. Cl. .............. 710/1; 327/63; 327/66; 327/87; 327/205; 327/539; 323/313; 323/316; 323/282

(58) Field of Search .............. 327/65, 77, 66, 327/87, 63, 205, 539; 323/313, 316, 282; 710/1

(56) References Cited

U.S. PATENT DOCUMENTS

| | | | | |
|---|---|---|---|---|
| 4,072,870 A | | 2/1978 | Davis | 327/65 |
| 4,195,283 A | * | 3/1980 | Ishikawa | 341/118 |
| 4,654,545 A | * | 3/1987 | Giordano | 327/80 |
| 5,122,680 A | * | 6/1992 | Stakely et al. | 327/73 |
| 5,155,386 A | * | 10/1992 | Abdi | 327/67 |
| 5,225,811 A | * | 7/1993 | Audy | 340/584 |
| 5,581,170 A | * | 12/1996 | Mammano et al. | 320/116 |
| 5,587,650 A | * | 12/1996 | Massie | 323/282 |
| 5,614,857 A | * | 3/1997 | Lim et al. | 327/205 |
| 5,747,978 A | * | 5/1998 | Gariboldi et al. | 323/313 |
| 5,995,011 A | * | 11/1999 | Kurihara et al. | 340/663 |
| 6,163,183 A | * | 12/2000 | Azimi et al. | 327/142 |
| 6,208,187 B1 | * | 3/2001 | Callahan, Jr. | 327/206 |
| 6,229,350 B1 | * | 5/2001 | Ricon-Mora | 327/77 |
| 6,229,472 B1 | * | 5/2001 | Nishida | 341/161 |
| 6,281,828 B1 | * | 8/2001 | Kimura et al. | 341/155 |
| 6,300,810 B1 | * | 10/2001 | Hardee | 327/206 |
| 6,665,354 B1 | * | 12/2003 | Drapkin et al. | 375/316 |

* cited by examiner

*Primary Examiner*—Tammara Peyton
(74) *Attorney, Agent, or Firm*—Christopher P. Maiorana, PC

(57) ABSTRACT

The present invention concerns an apparatus comprising a first circuit and a second circuit. The first circuit may be configured to generate a reference output voltage in response to a plurality of reference voltages. The second circuit may be configured to generate an output voltage in response to the reference output voltage and an unknown voltage. The output voltage may comprise accurately controlled hysteresis.

15 Claims, 4 Drawing Sheets

REFERENCE-SWITCH HYSTERESIS FOR COMPARATOR APPLICATIONS

FIELD OF THE INVENTION

The present invention relates to a method and/or architecture for hysteresis in a comparator generally and, more particularly, to a method and/or architecture for a reference-switch hysteresis for comparator applications.

BACKGROUND OF THE INVENTION

Conventional approaches for comparator designs implement hysteresis utilizing a form of positive feedback. Traditionally, hysteresis that is incorporated into a design using positive feedback does not provide accurately or efficiently controlled hysteresis. Hysteresis is the measure for a comparator for which an input threshold changes as a function of the input (or output) level. More specifically, when the input passes the input threshold, the output changes state and the input threshold is subsequently reduced so that the input must return beyond the initial input threshold before the output of the comparator changes state again.

Such conventional implementations are dependent on temperature and process variations resulting in an uncontrolled amount of hysteresis. An example of one conventional approach can be found in U.S. Pat. No. 4,072,870 entitled "Comparison circuit having programmable hysteresis", which is hereby incorporated by reference in its entirety. The conventional approach of U.S. Pat. No. 4,072,870 implements a steering current through a resistor to produce symmetrical hysteresis. However, the conventional approach does not present accurate or efficiently controlled hysteresis.

SUMMARY OF THE INVENTION

The present invention concerns an apparatus comprising a first circuit and a second circuit. The first circuit may be configured to generate a reference output voltage in response to a plurality of reference voltages. The second circuit may be configured to generate an output voltage in response to the reference output voltage and an unknown voltage. The output voltage may comprise accurately controlled hysteresis.

The objects, features and advantages of the present invention include providing a method and/or architecture for implementing reference-switch hysteresis in comparator applications that may (i) implement different voltage reference levels to produce an effective amount of hysteresis, (ii) provide an accurate and constant amount of hysteresis, (iii) provide bandgap controlled reference voltages levels, (iv) provide immunity against temperature, supply and process corner variations and/or (v) provide controlled and accurate reference voltage levels, resulting in a controlled and accurate amount of hysteresis.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
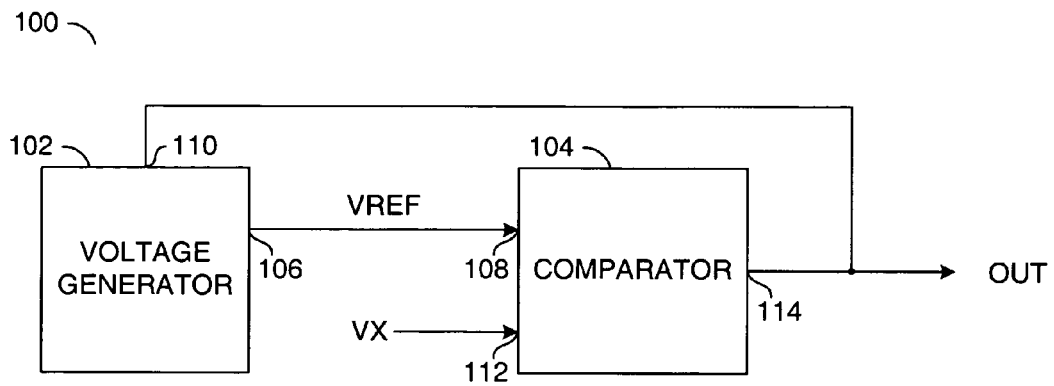
FIG. 1 is a block diagram of a preferred embodiment of the present invention.

Referring to FIG. 1, a block diagram of a circuit 100 is shown in accordance with a preferred embodiment of the present invention. The circuit 100 may be implemented to provide reference switched hysteresis (e.g., on chip bias voltage switched hysteresis), for example, in comparator applications. The circuit 100 may provide immunity against temperature, supply and process corner variations. Additionally, the circuit 100 may provide controlled and accurate reference voltage levels (e.g., on chip bias voltages), resulting in a controlled and accurate amount of hysteresis. The structure of the circuit 100 generally comprises a voltage generator block (or circuit) 102 and a comparator block (or circuit) 104.

The voltage generator circuit 102 may have an output 106 that may present a signal (e.g., VREF) and an input 110 that may receive the signal (e.g., OUT). The signal VREF may be implemented as a reference voltage, a voltage level, a voltage on a node or other appropriate signal in order to meet the criteria of a particular implementation. The comparator circuit 104 may have an input 108 that may receive the signal VREF, an input 112 that may receive a signal (e.g., VX) and an output 114 that may present the signal OUT. In one example, the signal VREF may provide a bandgap controlled reference voltage to the comparator 104. The bandgap controlled reference voltage may be implemented to control hysteresis of the comparator 104. The signal VX may be implemented as a voltage level, a voltage on a node or other appropriate signal in order to meet the criteria of a particular implementation. However, a particular voltage level of the signal VX may be unknown. For example, the signal VX may be received from another circuit (e.g., VX may be the input to a low-battery detect circuit).

The circuit 100 may provide accurate hysteresis control external to the comparator 104 (e.g., the voltage generator circuit 102). The circuit 100 may allow the comparator 104 to have a minimal amount of hysteresis to provide a robust design. However, the amount of hysteresis of the comparator 104 may be required to be smaller than an overall hysteresis of the circuit 100, in order to ensure accurately controlled hysteresis. The voltage generator 102 may present the signal VREF by switching between a number of internal voltages. The voltage generator 102 may generate the signal VREF to provide the required hysteresis (to be described in more detail in connection with FIG. 2). The circuit 100 may provide accurate control over a variety of hysteresis levels (via the signal OUT). Alternatively, the signal OUT may be presented to a digital filter (not shown) for further processing. The digital filter may be optionally implemented to meet the design criteria of a particular implementation.

Figure 2:
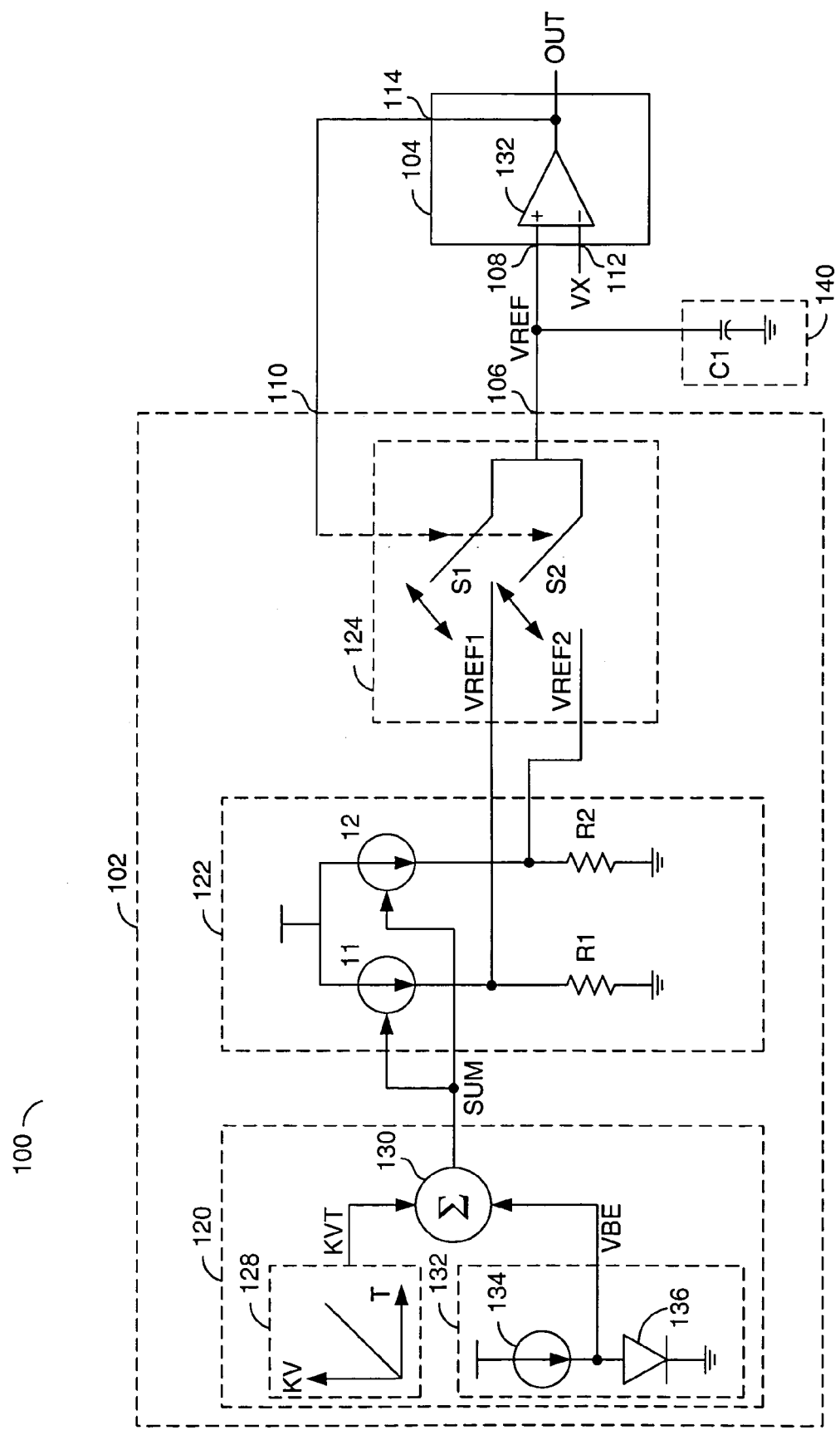
FIG. 2 is a detailed block diagram of the present invention.

Referring to FIG. 2, a more detailed diagram of the circuit 100 is shown. The voltage generator 102 generally comprises a circuit (or block) 120, a circuit (or block) 122 and a circuit (or block) 124. The circuit 120 may be implemented as a bandgap reference circuit. The circuit 122 may be implemented as a voltage reference generator circuit. The circuit 124 may be implemented as a reference switch circuit. The circuit 120 generally presents a signal (e.g., SUM) to the circuit 122. The circuit 120 generally comprises a positive temperature coefficient circuit (or block) 128, a summing circuit (or block) 130 and a negative temperature coefficient circuit (or block) 132.

The positive temperature coefficient circuit 128 may generate a signal (e.g., KVT). The signal KVT may be presented to the summing circuit 130. The negative temperature coefficient circuit 132 may present a signal (e.g., VBE) to the summing circuit 130. In one example, the signal VBE may be implemented as a negative temperature coefficient voltage. Additionally, the signal VBE may be generated by a diode connected bipolar device. The negative temperature coefficient circuit 132 generally comprises a current source 134 and a diode 136. However, other appropriate circuits may be implemented accordingly to meet the design criteria of a particular implementation. The current source 134 may be coupled to a first side of the diode 136. A second side of the diode 136 may be coupled to ground. Additionally, the current source 134 and the diode 136 may be configured to generate the signal VBE.

The summing circuit 130 generally sums the signal VBE and the signal KVT. The summing circuit 130 may generate the signal SUM. The signal SUM may be implemented as a summation signal. In one example, the signal SUM may be implemented as a control voltage. In another example, the signal SUM may be implemented as a control current. However, the signal SUM may be implemented as another appropriate signal in order to meet the criteria of a particular implementation.

The circuit 122 generally comprises a current source (or generator) I1, a current source (or generator) I2, a resistor R1 and a resistor R2. The circuit 100 (of FIG. 2) illustrates two reference current sources (e.g., I1 and I2). However, another number of current sources may be implemented in order to meet the design criteria of a particular application.

In one example, the current sources I1 and I2 may be implemented as voltage controlled current sources (VCCS). In another example, the current sources I1 and I2 may be implemented as current controlled sources (CCCS). However, the current sources I1 and I2 may be implemented as other appropriate current sources in order to meet the criteria of a particular implementation.

Each of the current sources I1 and I2 may be coupled to a first side of the resistors R1 and R2, respectively. A second side of the resistors R1 and R2 may be coupled to ground. The current sources I1 and I2 generally receive the signal SUM. The signal SUM may control the current sources I1 and I2. The current source I1 generally presents a signal (e.g., VREF1) and the current source I2 generally presents a signal (e.g., VREF2). The signals VREF1 and VREF2 may be implemented as a reference voltage, a voltage level, a voltage on a node, or other appropriate signals in order to meet the criteria of a particular implementation. The current source I1 and the resistor R1 may control the voltage level of the signal VREF1 in response to the signal SUM. The current source I2 and the resistor R2 may control the voltage level of the signal VREF2 in response to the signal SUM. The signals VREF1 and VREF2 are generally presented to the reference switch circuit 124.

The reference switch circuit 124 generally presents the signal VREF to the comparator circuit 104. Additionally, the reference switch circuit 124 may receive the signal OUT. In one example, the signal OUT may be implemented as a feedback signal. The signal OUT may control switching of the reference switch 124. Additionally, the signal OUT may control the voltage level of the signal VREF. The reference switch circuit 124 generally comprises a switch S1 and a switch S2. The signal VREF1 may be presented to a first side of the switch S1. A second side of the switch S1 may be connected to the output 106 (e.g., the node VREF). The signal VREF2 may be presented to a first side of the switch S2. A second side of the switch S2 may be connected to the output 106 (e.g., the node VREF). The switch S1 and the switch S2 may be controlled by the signal OUT. The switches S1 and S2 may control the voltage level of the signal VREF.

The bandgap reference circuit 120 generally controls the current sources I1 and I2 via the signal SUM. The current generator I1 and the resistor R1 may control the reference voltage level VREF1, where VREF1 is generally equal to I1*R1. The current source I2 and the resistor R2 may control the reference voltage level VREF2, where VREF2 is generally equal to I2*R2. The resistors R1 and R2 may have the same characteristics (e.g., resistance) as resistors (not shown) within the bandgap reference circuit 120. The bandgap reference circuit 120 may control the voltage reference levels VREF1 and VREF2. The voltage reference levels VREF1 and VREF2 may be accurately controlled (e.g., process corners, supply and temperature independent) via the bandgap reference circuit 120.

The signal VREF is generally switched to be equal to either the signal VREF1 or the signal VREF2. The signal VREF may be switched in response to the feedback signal OUT. The reference switch circuit 124 may be implemented to provide an appropriate voltage level of the signal VREF. Switching of the signal VREF may provide a controlled amount of hysteresis. The signal VREF is generally presented to the input 108 of the comparator block 104. Additionally, the signal VX is generally presented to the input 112 of the comparator block 104. The comparator block 104 generally comprises a comparator 132. A positive input of the comparator 132 may receive the signal VREF and a negative input of comparator 132 may receive the signal VX. The comparator 132 may compare the signal VREF and the signal VX. Additionally, the comparator 132 may generate the signal OUT. The comparator 132 may generate the signal OUT in response to a voltage level of the signal VREF and a voltage level of the signal VX.

Additionally, the circuit 100 may optionally comprise a circuit 140. The circuit 140 may be implemented as a capacitance block (or circuit). The circuit 140 may be optionally implemented to control a voltage level of the signal VREF. The circuit 140 generally comprises a capacitor C1. A first side of the capacitor C1 may be coupled to the node VREF. A second side of the capacitor C1 may be coupled to ground. A capacitance of the capacitor C1 may be varied in order to meet the criteria of a particular implementation.

Figure 3:
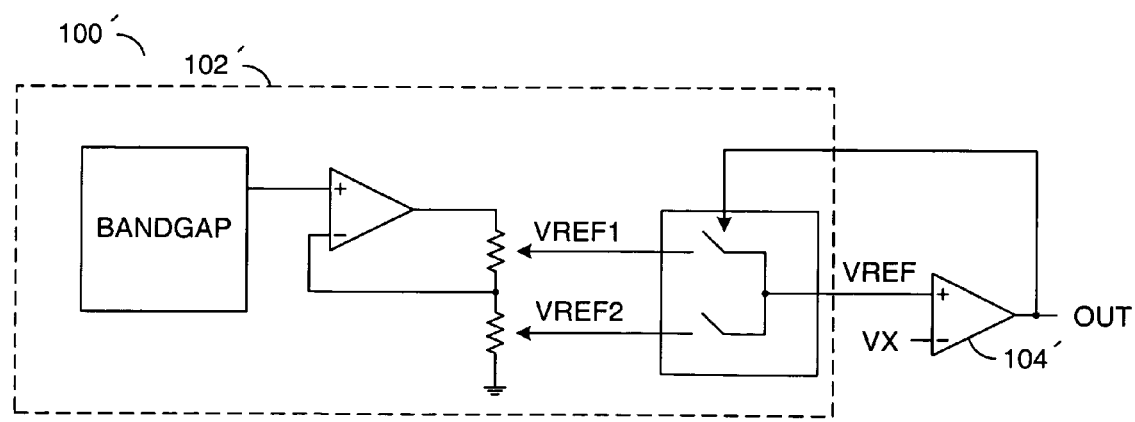
FIG. 3 is a detailed block diagram of an alternate embodiment of the present invention.

Referring to FIG. 3, an alternate embodiment of the present invention is shown marked with primed notation. The circuit 100' may be similar to the circuit 100. The circuit 100' illustrates a scheme to generate two or more references from a bandgap voltage reference.

Figure 4:
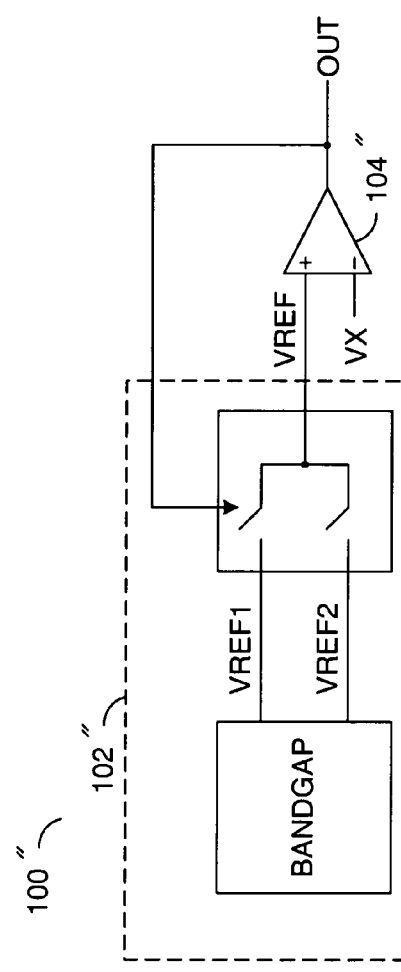
FIG. 4 is a detailed block diagram of an alternate embodiment of the present invention.

Referring to FIG. 4, an alternate embodiment of the present invention is shown marked with double primed notation. The circuit 100" may be similar to the circuit 100. The circuit 100" may illustrate an implementation where the voltages VREF1 and VREF2 are directly generated by the bandgap circuit 110". The circuit 100" illustrates an example that uses a bandgap in which the bandgap voltage is already across a resistor divider and so multiple VREFs are available. No additional operational amplifier is required.

Figure 5:
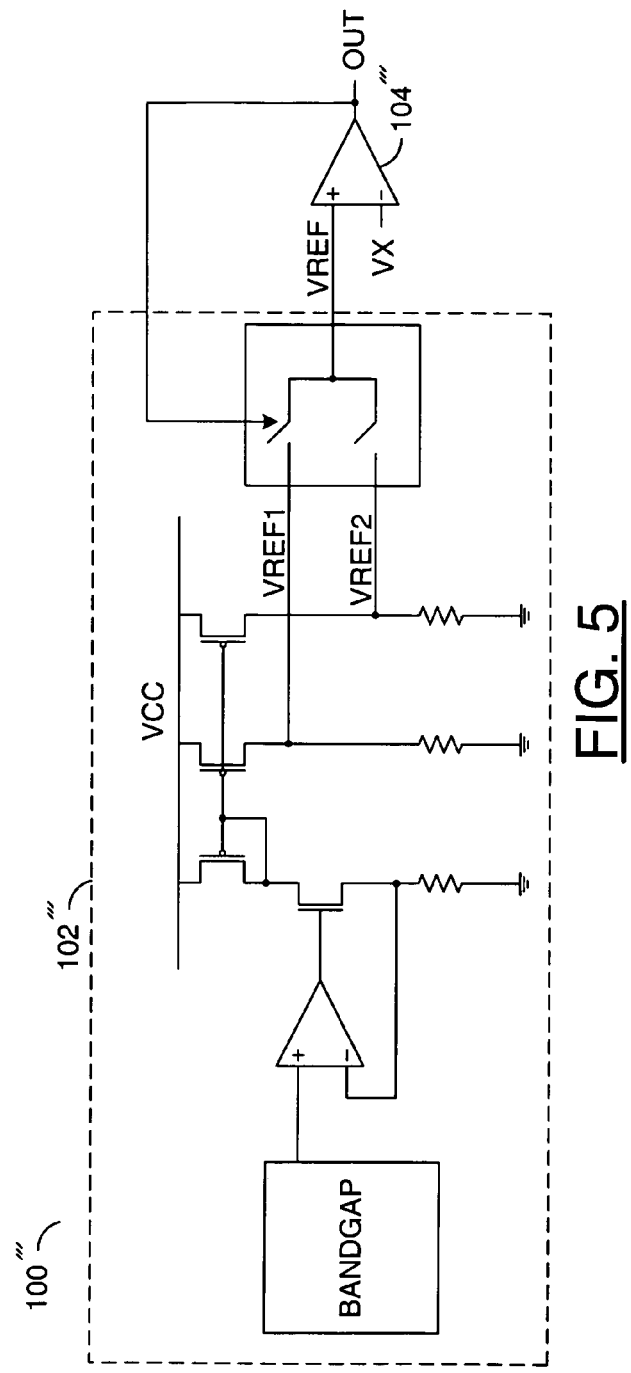
FIG. 5 is a detailed block diagram of an alternate embodiment of the present invention.

Referring to FIG. 5, an alternate embodiment of the present invention is shown marked with triple primed notation. The circuit 100''' may be similar to the circuit 100. The circuit 100''' may be useful to distribute VREFs via currents to avoid grounding problems.

Figure 6:
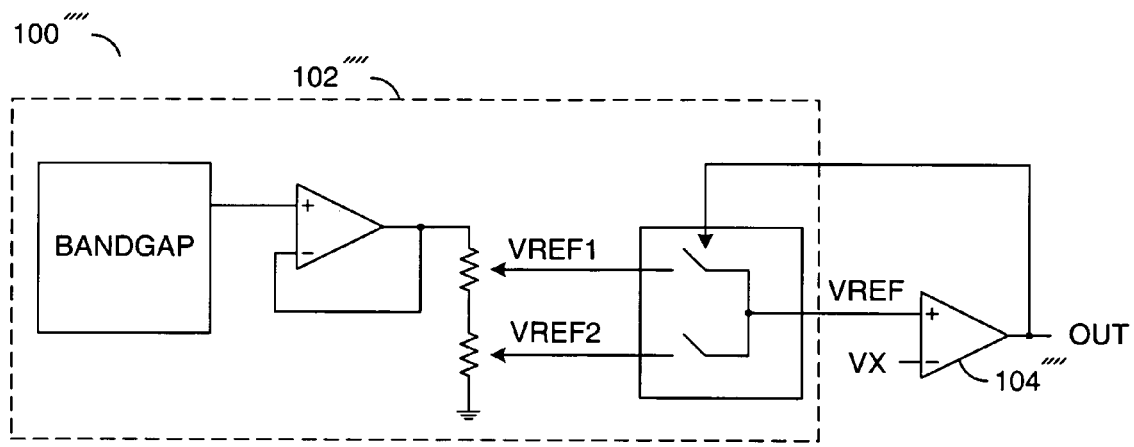
FIG. 6 is a detailed block diagram of an alternate embodiment of the present invention.

Referring to FIG. 6, an alternate embodiment of the present invention is shown marked with quadruple primed notation. The circuit 100'''' may be similar to the circuit 100. The circuit 100'''' may implement the bandgap voltage that does not have a high gain. The circuit 100'''' may be usable for low levels of VREF1 and VREF2.

Figure 7:
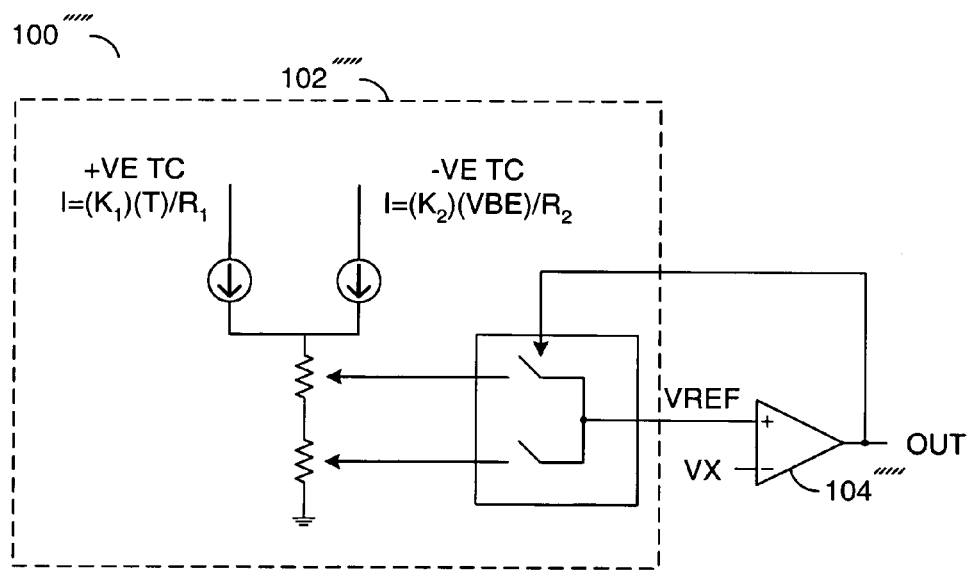
FIG. 7 is a detailed block diagram of an alternate embodiment of the present invention.

Referring to FIG. 7, an alternate embodiment of the present invention is shown marked with five primed notations. The circuit 100''''' may be similar to the circuit 100. The circuit 100''''' may implement positive (+ve) TC and negative (−ve) TC currents that are summed. The choice of the resistance R makes VREF~(K2/R2)*(VGO).

The circuit 100 may provide accurately controlled hysteresis, external to a comparator (e.g., via the voltage generator 102). The circuit 100 may implement a number of reference voltages (e.g., VREF1 and VREF2) to provide the accurately controlled hysteresis. When switched appropriately by the switches S1 and S2, the circuit 100 may provide a controlled amount of hysteresis via switching of the signal VREF.

The bandgap reference circuit 120 may be implemented to provide temperature, supply and process independent signals (e.g., VREF1 and VREF2). However, the voltage reference levels VREF1 and VREF2 may only be as accurate as the bandgap reference circuit 120. The bandgap reference circuit 120 may allow the circuit 100 to provide voltage levels that may be stable over temperature, supply process corners. However, other sources of reference may also be implemented to meet the design criteria of a particular implementation. For example, a Zener reference may be implemented with a buffer and a resistor divider.

The circuit 100 may implement bandgap-controlled voltage reference levels (e.g., VREF1 and VREF2) to produce an effective amount of hysteresis (on the signal OUT). The hysteresis on the signal OUT may be equal to the difference between the reference levels VREF1 and VREF2. The circuit 100 may be implemented where an accurate and dependable amount of hysteresis is required. The circuit 100 may provide voltage reference levels that may be bandgap controlled, offering immunity against temperature, supply and process corner variations. The bandgap generated voltage reference levels may be used to provide stable references over temperature, supply and process corners. Since the reference levels may be accurately controlled, the circuit 100 may provide a controlled and accurate amount of hysteresis. The circuit 100 may be implemented where the control of hysteresis levels is of primary importance.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   means for using a voltage generator circuit for selecting a reference output voltage from a plurality of bandgap controlled reference voltages in response to a feedback of an output voltage signal; and
   means for using a comparator circuit for generating said output voltage in response to a comparison between said reference output voltage and an unknown voltage, wherein said output voltage comprises accurately controlled hysteresis and (ii) said means for using a voltage generator circuit includes a summation means for controlling a voltage reference means in response to signals from a process compensation means and a reference means.

2. A method for providing accurate and controlled hysteresis comprising the steps of:
   (A) using a voltage generator circuit for selecting a reference output voltage from a plurality of bandgap controlled reference voltages in response to a feedback of an output signal; and
   (B) using a comparator circuit for generating said output voltage in response to a comparison between said reference output voltage and an unknown voltage, wherein (i) said output voltage comprises accurately controlled hysteresis and (ii) step (A) uses a summation circuit to control a voltage reference circuit in response to signals from a process compensation circuit and a reference circuit.

3. The method according to claim 2, wherein step (A) further comprises:
   switching between said plurality of bandgap controlled reference voltages.

4. The method according to claim 2, wherein step (A) further comprises:
   controlling a voltage level of said plurality of bandgap controlled reference voltages.

5. The method according to claim 2, wherein step (B) is further responsive to voltage and temperature variations.

6. The method according to claim 2, wherein step (A) further comprises the sub-steps of:
   (A-1) summing a positive temperature coefficient and a negative temperature coefficient; and
   (A-2) controlling a voltage level of said plurality of reference voltages.

7. An apparatus comprising:
   a first circuit configured to generate a reference output voltage in response to a plurality of reference voltages; and
   a second circuit configured to generate an output voltage in response to a comparison between said reference output voltage and an unknown voltage, wherein (i) said output voltage comprises accurately controlled hysteresis and (ii) said first circuit includes a summation circuit configured to control a voltage reference circuit in response to signals from a process compensation circuit and a reference circuit.

8. The apparatus according to claim 7, wherein:
   said first circuit comprises a voltage generator circuit; and
   said second circuit comprises a comparator circuit.

9. The apparatus according to claim 8, wherein said plurality of reference voltages comprise a plurality of bandgap controlled reference voltages.

10. The apparatus according to claim 8, wherein said voltage generator circuit is further configured to provide substantial immunity against voltage, process and temperature variations.

11. The apparatus according to claim 9, wherein said voltage generator circuit comprises:
   a bandgap reference circuit;
   a voltage reference circuit configured to generate said plurality of bandgap controlled reference voltages; and
   a reference switch circuit configured to switch between said plurality of bandgap controlled reference voltages to generate said reference output voltage.

12. The apparatus according to claim 11, wherein said voltage reference circuit comprises:
   a plurality of current sources configured to generate said plurality of bandgap controlled reference voltages; and
   a plurality of resistors each coupled to at least one of said plurality of current sources.

13. The apparatus according to claim 11, wherein said reference switch circuit comprises:
   a plurality of switches each (i) configured to receive at least one of said plurality of bandgap controlled reference voltages and (ii) coupled to said reference output voltage.

14. The apparatus according to claim 13, wherein said plurality of switches are configured in response to said output voltage.

15. The apparatus according to claim 8, wherein said plurality of reference voltages comprise bandgap controlled voltages.

* * * * *